US010209411B2

(12) United States Patent
Goehnermeier et al.

(10) Patent No.: US 10,209,411 B2
(45) Date of Patent: Feb. 19, 2019

(54) MULTILAYER MIRROR

(71) Applicant: Carl Zeiss SMT GmbH, Oberkochen (DE)

(72) Inventors: Aksel Goehnermeier, Essingen-Lauterburg (DE); Gisela Von Blanckenhagen, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 224 days.

(21) Appl. No.: 15/078,105

(22) Filed: Mar. 23, 2016

(65) Prior Publication Data
US 2016/0202396 A1 Jul. 14, 2016

Related U.S. Application Data

(63) Continuation of application No. PCT/EP2013/069689, filed on Sep. 23, 2013.

(51) Int. Cl.
F21V 9/04 (2018.01)
F21V 9/06 (2018.01)
(Continued)

(52) U.S. Cl.
CPC ......... *G02B 5/0816* (2013.01); *G02B 5/0891* (2013.01); *G03F 7/702* (2013.01);
(Continued)

(58) Field of Classification Search
CPC .. G02B 5/0816; G02B 5/0833; G02B 5/0875; G02B 5/0891; G02B 5/285;
(Continued)

(56) References Cited

U.S. PATENT DOCUMENTS 8,194,322 B2 6/2012 Shiraishi
9,696,632 B2 7/2017 Huber et al.
(Continued)

FOREIGN PATENT DOCUMENTS

DE 10227367 A1 1/2004
JP S62226047 A 10/1987
(Continued)

OTHER PUBLICATIONS

International Search Report in counterpart International Application No. PCT/EP2013/069689, dated Jul. 23, 2014.
(Continued)

*Primary Examiner* — Mustak Choudhury
(74) *Attorney, Agent, or Firm* — Edell, Shapiro & Finnan, LLC

(57) ABSTRACT

A multilayer mirror for reflecting extreme ultraviolet (EUV) radiation, the mirror has a substrate and a stack of layers formed on the substrate. The stack of layers comprises layers including a low index material and a high index material, the low index material having a lower real part of the refractive index than the high index material at a given operating wavelength $\lambda$. The mirror provides a first peak of reflectivity of 20% or more at a first wavelength $\lambda_1$ in a first wavelength band extending from 6 nm to 7 nm and a second peak of reflectivity of 20% or more at a second wavelength $\lambda_2$ in a second wavelength band extending from 12.5 nm to 15 nm.

16 Claims, 5 Drawing Sheets

(51) Int. Cl.
  *G02B 5/08* (2006.01)
  *G02B 5/20* (2006.01)
  *G03F 7/20* (2006.01)
  *G21K 1/06* (2006.01)

(52) U.S. Cl.
  CPC ...... *G03F 7/70316* (2013.01); *G03F 7/70575* (2013.01); *G03F 7/70958* (2013.01); *G21K 1/062* (2013.01); *G21K 2201/061* (2013.01)

(58) Field of Classification Search
  CPC ............... G02B 5/3041; G03F 7/70575; G03F 7/70958; G03F 7/0058; G03F 7/702; G03F 7/70166; G03F 7/70316; G03F 7/70233; G03F 7/70241; G03F 7/70333; G03F 7/70916; G03F 7/70925; G03F 7/70983; G03F 1/24; G03F 1/34; G03F 7/182; G03F 7/708; G03F 7/7015; G03F 7/70591; G21K 1/06; G21K 1/062
  USPC ....... 359/358–360, 350, 582, 587, 838, 883, 359/900; 378/34, 35, 84; 428/627–663
  See application file for complete search history.

(56) References Cited

U.S. PATENT DOCUMENTS

| | | |
|---|---|---|
| 2003/0043456 A1 | 3/2003 | Singh |
| 2003/0185341 A1 | 10/2003 | Michaelsen |
| 2005/0111083 A1 | 5/2005 | Yakshin et al. |
| 2006/0244937 A1 | 11/2006 | Nolscher et al. |
| 2006/0245057 A1 | 11/2006 | Van Herpen et al. |
| 2008/0259439 A1 | 10/2008 | Shiraishi |
| 2009/0097104 A1* | 4/2009 | Kandaka ................ B82Y 10/00 359/359 |
| 2011/0194087 A1* | 8/2011 | Tsarfati ................... B82Y 10/00 355/67 |
| 2015/0055108 A1 | 2/2015 | Huber et al. |

FOREIGN PATENT DOCUMENTS

| | | |
|---|---|---|
| JP | H06174897 A | 6/1994 |
| JP | 2003318094 A | 11/2003 |
| JP | 2007163614 A | 6/2007 |
| JP | 2008270808 A | 11/2008 |
| JP | 2011527416 A | 10/2011 |
| JP | 2015515127 A | 5/2015 |
| TW | 200643481 A | 12/2006 |
| WO | 2010091907 A1 | 8/2010 |

OTHER PUBLICATIONS

Meekins John, F. et al., "Optimization of layered synthetic microstructures for narrowband . . . ", Applied Optics, vol. 25, No. 16, Aug. 15, 1986, 2757-2763, XP002726885.
Singh, M. et al., "Improved theoretical reflectivities of extreme . . . ,", Proc. SPIE, 3997, 412-419, 2000.
Office Action in corresponding Japanese Application 2016543326, dated Aug. 8, 2017, along with English Translation.
Office Action in corresponding Taiwanese Application 103132231, dated May 24, 2018, along with English Translation.
Japanese Decision to Grant corresponding JP application 2016-543326, dated Jul. 31, 2018.

* cited by examiner

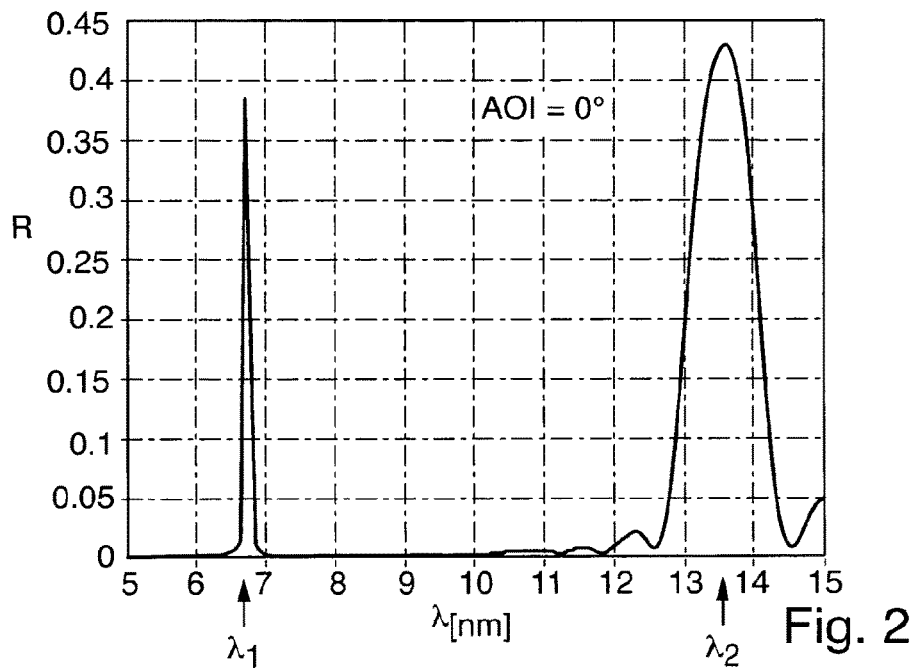
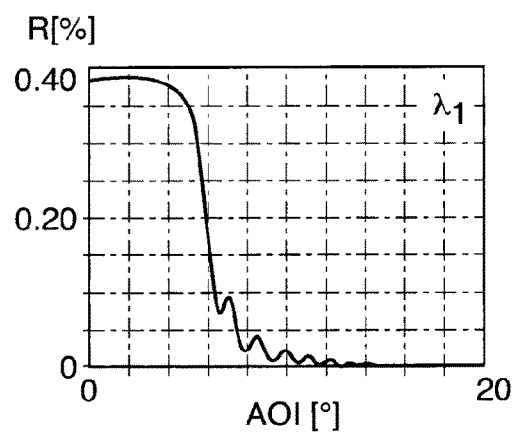
Fig. 3
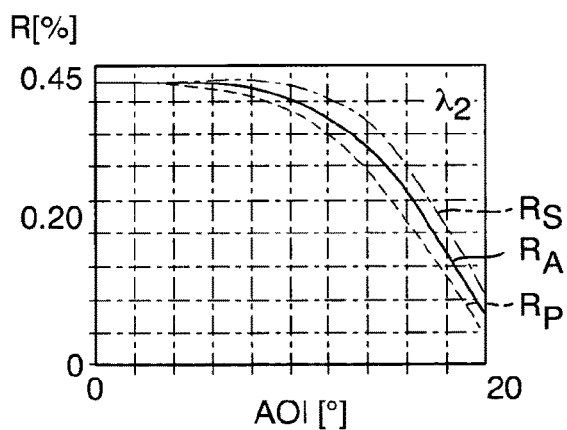
Fig. 4

MULTILAYER MIRROR

CROSS REFERENCE TO RELATED APPLICATIONS

This is a Continuation of International Application PCT/EP2013/069689, with an international filing date of Sep. 23, 2013, which was published under PCT Article 21(2) in English, and the disclosure of which is incorporated into this Continuation application in its entirety by reference.

FIELD OF THE INVENTION

The invention relates to a multilayer mirror for reflecting extreme ultraviolet (EUV) radiation and to optical systems comprising at least one such mirror.

BACKGROUND

Optical systems employed in the field of EUV lithography, such as illumination systems and projection systems in a EUV lithography apparatus, require reflective optical elements providing relatively high reflectivity for electromagnetic radiation from the extreme ultraviolet (EUV) wavelength range. The EUV wavelength range includes wavelengths between about 5 nm and 20 nm, for example. The lower end of this wavelength range is sometimes also denoted as beyond EUV (BEUV) or soft X-ray range. The optical elements employed in a EUV lithography system include curved or plane mirrors, reflective photo masks and other reflective elements capable of guiding or structuring EUV radiation. Reflective optical elements are also needed in optical inspection systems used to inspect photomasks or other patterning arrangements using EUV radiation, or in EUV microscopes.

Any material used to reflect radiation in the EUV or soft x-ray range reflects only a few percents of incident radiation because the real part of the refractive index is close to unity. The complex refractive index n of a material may be described as a sum of the real part $(1-\delta)$ and the imaginary part $i\beta$ of the refractive index in accordance with $n=(1-\delta)+i\beta$. In this notation, the dimensionless parameter $\delta$ describes the deviation of the real part of the refractive index n from the value 1 and may be denoted as "refractive index decrement". The dimensionless parameter $\beta$ represents the commonly used extinction coefficient k. Differences in the real part of the refractive index at an interface between adjacent materials govern the contribution to reflectivity of the interface. Those differences $(\Delta\delta)$ are sometimes referred to as "refractive index contrast". The magnitude of the extinction coefficient is indicative of the amount of absorption of EUV radiation in a material and includes scattering properties on atomic level.

Due to the fact that only small differences in the real part of refractive index exist in the EUV or soft X-ray range, a reflective optical element operating at normal incidence or near normal incidence of EUV radiation must be designed as a multilayer mirror in order to be capable of reflecting EUV radiation with reasonably high reflectivity, for example with reflectivity of 20% or more.

In this application, the term "multilayer mirror" generally refers to any reflective optical element having multiple material layers effective to reflect EUV or soft X-ray radiation.

A multilayer mirror may be described as comprising a substrate and a stack of layers formed on the substrate, wherein the stack of layers comprises layers comprising a "low index material" and "high index material", the low index material having a lower real part of the refractive index than the high index material at a given operating wavelength $\lambda$ in the EUV range.

It is important to note that the terms "low index material" and "high index material" do not describe absolute properties of the materials. Instead, "high" and "low" denote properties relative to adjacent layers. A specific first material may be a "low index material" relative to a specific second material, while the same first material may be a "high refractive index material relative to a third material different from the first material.

The material having a relatively lower real part of the refractive index at the operating wavelength (i.e. the low index material) is commonly denoted by the capital letter "L", while the material having a relatively higher real part of the refractive index (i.e. the high index material) at the operating wavelength is commonly denoted by the capital letter "H".

Multilayer mirrors typically include a plurality of repetitive units stacked upon each other in a recurring sequence. A repetitive unit including a single low index material layer and a single adjacent high index material layer may be referred to as "bilayer" or two-layer repetitive unit. A repetitive unit may include one or more additional layers, for example a diffusion barrier interlayer interposed between a low index material layer and a high index material layer to reduce intermixing of the adjacent materials at the interface. A sequence of repetitive units in a multilayer mirror forms a stack of layers which essentially simulates a crystal partially reflecting the incident radiation at interfaces between adjacent layers. The thicknesses of the individual layers as well as the total thickness of the repetitive units can be constant across the entire multilayer system, or they can vary laterally and/or in depth depending on which reflection profile is to be achieved.

A specific problem in the EUV region is that all useful materials absorb the radiation to a certain extent. To reduce the effect of absorption losses on reflectivity, the geometrical thicknesses of the two components of the bilayer (low and high index material) are typically adjusted to deviate slightly from the optical path length of $\lambda/4$, where $\lambda$ is the design wavelength. Specifically, the thickness of the high absorption layer, $d_h$, (i.e. the thickness of the material having the higher extinction coefficient k) is often set slightly lower than the thickness $d_l$ of the low absorption layer. A partition ratio $\Gamma = d_h/d$ of the multilayer is typically defined to describe this approach. The partition ratio is defined as the ratio of the thickness of the material having the higher extinction coefficient, k, to the total thickness d of the period, also denoted as "period thickness". Partition ratios in the order of $\Gamma=0.4$ are commonly used.

Note that the material with the higher extinction coefficient (indicated by lower case letter "h") may be the material having the relatively lower real part of refractive index (indicated by capital letter "L"), and vice versa.

An optimum thickness of a repetitive unit may be calculated for a given wavelength and a given range of angles of incidence using Bragg's law.

According to Singh (e.g. US 2003/0043456 A1) or M. Singh and J. J. M. Braat: "Improved Theoretical Reflectivities of Extreme Ultraviolet Mirrors" in: Proc. SPIE, 3997, 412-419 (2000) two designs predominate for the 11-16 nm wavelength spectral region: Mo/Be for the 11.3 nm window consisting typically of 80 periods and the Mo/Si system for the 13.4 nm window, typically consisting of 40-50 periods. In each multilayer system, Molybdenum (Mo) forms the low index material layers, while Beryllium (Be) and Silicon (Si) form the respective high index material layers. These designs yield maximum theoretical reflectivities of R≈0.78 for the Mo/Be multilayer mirror, and R≈0.74 for the Mo/Si multilayer mirror while taking into account a highly absorbing native oxide layer with about 2 nm thickness on the surface Si layer.

Singh reports that the reflectivity of multilayered EUV mirrors tuned for 11-16 nm, for which the two-component Mo/Be and Mo/Si multilayered systems were previously used, may be enhanced by incorporating additional elements and their compounds mainly from period 5 of the periodic table. In addition, the reflectivity performance of the multilayer mirrors may be further enhanced by a numerical global optimization procedure by which the layer thicknesses are varied for optimum performance in contradistinction to previous constant layer thickness (i.e. constant partition ratio) multilayer stacks. By incorporating additional materials with differing complex refractive indices in various regions of a stack, or by wholly replacing one of the components (typically Mo), Singh observed peak reflectivity enhancements of up to 5% for a single mirror compared to a standard unoptimized stack. Rb, RbCl, Sr, Y, Zr, Ru, Rh, Tc, Pd, Nb and Be were used as the additional materials. Protective capping layers of B, Ru, Rh, C, $Si_3N_4$, SiC, in addition to protecting the mirrors from environmental attack, may serve to improve the reflectivity characteristics.

Besides various attempts to increase maximum reflectivity there have also been many attempts to increase spectral and/or angular bandwidth of multilayer mirrors (see e.g. US 2005/0111083 A1)

It has further been proposed that radiation with a wavelength of less than 10 nm could be used in microlithograpy, for example 6.7 nm or 6.8 nm. In the context of lithography, wavelengths of less than 10 nm are sometimes referred to as "beyond EUV", or as "soft x-rays". However, in the context of the present application, this wavelength range is encompassed by the term "EUV radiation".

To reflect EUV radiation having a wavelength of about 6.7 nm, multilayer mirrors have been proposed having alternating layers of a metal, such as La, U or Th, and B or a B compound, such as $B_4C$ or $B_9C$. Such a multilayer mirror reflects the EUV radiation according to Bragg's Law. However, chemical interaction of for instance La and the B layer or the B compound layer may lead to interlayer diffusion (see e.g. WO 2010/091907).

US 2003/0185341 A1 suggests multilayer mirrors for wavelengths of about 6.64 nm having a multilayer structure consisting of at least a first layer of a lanthanum (La) containing compound and at least a second layer of a boron (B) containing compound alternately disposed on a substrate.

According to US 2011/0194087 A1 the maximum reflectivity theoretically achievable by multilayer systems for operating wavelengths in the wavelength range between 5 nm and 12 nm is smaller than in the wavelength range from about 12 nm to 20 nm. Also, the bandwidth of the reflected radiation is substantially smaller. Problems of interlayer diffusion are addressed, for example in multilayer mirrors where lanthanum is used as a low index material and boron or boron carbide is used as a high index material. As a solution it is proposed that a further layer of a nitride or a carbide of the material having the lower real part of the refractive index is arranged at an interface from the material having the higher real part of the refractive index to the material having the lower real part of the refractive index. The material having the lower real part of the refractive index may be lanthanum or thorium, for example.

SUMMARY

It is an object of the invention to provide a multilayer mirror useful in a wide field of applications in optical systems utilizing EUV or soft X-ray radiation.

As a solution to these and other objects, the invention, according to one formulation, provides a multilayer mirror according to claim 1. Preferred embodiments are given in the dependent claims. The wording of all the claims is incorporated into the description by reference.

A typical conventional multilayer mirror capable of reflecting extreme ultraviolet radiation (EUV-mirror) is effective only in a relatively narrow spectral range or "wavelength band". Different reflective coatings are therefore required if an optical system is intended to be used in another wavelength band outside of and different from the wavelength band for which the multilayer mirror has been designed originally. Further, manufacturing and operation of optical systems designed for the EUV wavelength range is quite expensive. As an increasing number of effective radiation sources for EUV radiation is developed, it would be desirable to have multilayer mirrors or optical systems provided with multilayer mirrors which can be operated with sufficient performance in at least two wavelength bands spectrally separated from each other.

One class of EUV radiation sources presently known provides sufficient radiation power in a wavelength range extending from 12.5 nm to 15 nm, for example at about 13.4 nm or 13.5 nm. More recently, new EUV radiation sources have been developed which provide even shorter wavelength at powers sufficient to operate EUV optical systems. Specifically, radiation sources emitting in a wavelength band from about 6.6 nm to about 7 nm appear promising candidates for future application.

A multilayer mirror according to the claimed invention is capable of reflecting EUV radiation from the first wavelength band (shorter wavelength) and from the second wavelength band each with respective reflectivity values of 20% or more, which may be sufficient for practical use, such as in lithography applications or microscopy applications.

As a consequence, an EUV optical system provided with multilayer mirrors according to the claimed invention can be operated either with radiation from the first wavelength band or with radiation from the second wavelength band, or with both radiation from the first and second wavelength band without need for reconstruction or exchange of mirrors.

As used herein, the term "mirror" refers to a reflective optical element capable of reflecting radiation at the respective wavelength. The mirror may be a plane mirror which could be used, for example, as a folding mirror to fold the radiation path in an illumination system or in a projection objective of a microlithography projection exposure system. The mirror may have a curved shape to form a concave mirror or a convex mirror. The mirror can form a single element (or facet) of a faceted mirror (multi-mirror array). A mirror can also be used as a photo mask in a EUV projection exposure system, if a structure for patterning the incident EUV radiation is present on the mirror. The mirror can also be a part of a system of switchable mirrors used as a multi element photo mask.

While a reflectivity in the range of 20% to 30% may be sufficient in some fields of application, preferred embodiments provide a first reflectivity $R_1$ greater than 30% at the first wavelength and, at the same time, a second reflectivity $R_2$ greater than 40% at the second wavelength. In lithography applications, for example, lower exposure times and higher throughput of exposed substrates can thereby be obtained.

Some embodiments are designed so that the first peak of reflectivity is generated at a first wavelength which is between 40% and 60% of the second wavelength, where the second peak of reflectivity is generated. In other words: the first wavelength is about half the second wavelength, or, vice versa, the second wavelength is about twice the first wavelength in these embodiments. Where this condition is fulfilled, additional degrees of freedom for designing the layer structure of the multilayer mirrors may be used.

In some embodiments the stack of layers comprises a first layer group formed on the substrate, the first layer group providing higher reflectivity for the first wavelength than for the second wavelength, and a second layer group formed on the first layer group, the second layer group providing higher reflectivity for the second wavelength than for the first wavelength. In this type of layer structure the first and second layer groups are spatially separated from each other such that the first subs-stack is closer to the substrate, whereas the second layer group is formed closer to the radiation incidence side of the stack of layers. Embodiments according to this type are also denoted as "bi-stack" in this application. The layer groups may also be denoted as "sub-stack" because a layer group forms only a fraction of the entire stack.

With this type of layer structure it is recognized that some materials suitable to form layers for EUV mirrors exhibit less absorption at shorter wavelength in the first wavelength band than at longer wavelength in the second wavelength band. Therefore, a layer group optimized to reflect the longer second wavelength should be arranged on the radiation entry side of the stack of layers so that sufficient radiation energy in the first wavelength range can pass through the second layer group into the first layer group to be reflected by the layers of the first layer group.

The layer structure and materials for bi-stacks may be selected in view of differences in the real part of the refractive index (refractive index contrast, M) between adjacent layers responsible for the contribution of each H/L transition within the layer structure to overall reflectivity. Materials or material combinations for the layers in the second layer group should be selected so that relatively high refractive index contrast is obtained for the second wavelength. Preferably, at the same time, the materials should exhibit relatively low absorption for the first wavelength so that enough radiation energy at the first wavelength can pass through the second layer group into the first layer group.

Therefore, the low index material and the high index material in the second layer group (on the radiation incidence side) should be selected from a group of materials having low absorption with extinction coefficient β less than 0.05, preferably 0.03 or less, at the first wavelength.

Further, in order to keep reflectivity for the first wavelength low, it is desirable to select the combination of low and high index material in the second layer group so that there is only small refractive index contrast Δδ between the materials.

For example, the low refractive index material in the second layer group may be selected from group consisting of molybdenum (Mo), niobium (Nb), niobium oxide (NbO, $NbO_2$, $Nb_2O_5$), molybdenum carbide ($Mo_2C$, MoC), silver (Ag), ruthenium (Ru), palladium (Pd), rhenium (Rh) or compounds thereof. The high refractive index material in the second layer group should preferably be selected from the group consisting of lanthanum (La), lanthanum nitride (LaN), barium (Ba), lithium (Li) and compounds thereof.

In a stack of layers, the alternating layers of the low index material and the high index material may form a number of consecutive two-layer repetitive units, wherein each two-layer repetitive unit comprises a single layer of the low index material and an adjacent single layer of the high index material so that a recurring sequence of alternating layers with transitions H/L and L/H is obtained. The corresponding repetitive unit thickness may be constant or may vary.

In preferred embodiments a first number N1 of repetitive units in the first layer group is greater than a second number N2 of repetitive units in the second layer group. The higher number of repetitive units in the first layer group closer to substrate and effective to reflect the shorter first wavelength may account for the fact that refractive index differences between lower and high index material for the shorter first wavelength tend to be smaller than refractive index differences at larger wavelength.

In order to obtain comparable levels of reflectivity in the first and second wavelength bands it may be preferable that the first number N1 is more than ten times the second number N2 so that the condition N1>10·N2 is fulfilled.

In term of absolute numbers of layers, it may be preferable that the first number N1 is greater than 100 and the second number N2 is less than 20. A small number of repetitive units in the second layer group may be beneficial so that little overall absorption is effected on radiation passing through towards the first layer group. At the same time, a large number of repetitive units in the first layer group (closer to the substrate) may compensate for smaller refractive index contrasts in materials selected to reflect the shorter first wavelength.

Another option for designing a stack of layers reflecting EUV radiation efficiently in two different wavelength bands may be particularly useful if a wavelength ratio between the smaller first wavelength and the greater second wavelength is roughly about 50%, for example between 40% and 60%. Some embodiments particularly effective under these conditions comprise a stack of layers comprising a plurality of four-layer repetitive units. A four-layer repetitive unit comprises a first layer of a first material, a second layer of a second material on the first layer, a third layer of a third material on the second layer, and a fourth layer of a fourth material on the third layer. Layer thicknesses and layer material are selected so that a first real part of the refractive index $(1-δ)_1$ of layer materials (first to fourth material) at the first wavelength $λ_1$ varies periodically in a depth direction of the stack of layers according to a first refractive index period length, a second real part of the refractive index $(1-δ)_2$ of layer materials (first to fourth material) at the second wavelength $λ_2$ varies periodically in the depth direction of the stack of layers according to a second refractive index period length, and the second refractive index period length is about twice the first refractive index period length. The term "about twice" as used here shall encompass period length ratio values in the range from 1.8 to 2.2, for example. In general, the ratio between the first and second refractive index period lengths shall correspond essentially to the ratio between the first and second wavelength.

This type of layer structure may be described as a layer structure which provides, for a given range of angles of incidence, a quarter wave stack effective for both the first and the second wavelength. The term "quarter wave stack" as used here denotes a stack of layers having a multitude of quarter wave layers. A quarter wave layer is a layer having an optical thickness of about one-fourth of the wavelength λ of incidence radiation (i.e. $\lambda/4$). The optical thickness n*d of a layer is the product of the geometric thickness d and the refractive index n of the layer material.

Each single layer in the stack (first to fourth layer) may have a first optical thickness corresponding to about one-fourth of the first wavelength $\lambda_1$, while the layer thicknesses are also selected such that each pair of two adjacent layers may have a second optical thickness corresponding to about one-fourth of the second wavelength $\lambda_2$. The term "about one-fourth of a wavelength" is intended to encompass deviations from an exact value $\lambda/4$ by ±20%.

Optical properties of a stack comprising multiple consecutive four-layer repetitive units may also be described as follows. A first difference $\Delta\delta_1$ of real parts of refractive index between adjacent layers at the first wavelength changes sign at each of consecutive transitions between layers so that the first difference $\Delta\delta_1$ of real parts of refractive index has the same sign at transitions between the first layer and the second layer and at transition between the third layer and the fourth layer, and opposite sign at transitions between the second layer and the third layer and at transitions between the fourth layer and a first layer of an adjacent four-layer repetitive unit, while a second difference $\Delta\delta_2$ of real parts of refractive index between adjacent layers at the second wavelength changes sign at every second of consecutive transitions between layers.

If these conditions are met, the entire multilayer structure (stack of layers) is effective as a distributed Bragg reflector for both the first wavelength $\lambda_1$ and the second wavelength $\lambda_2$, while the multilayer structure is "out of tune" for other wavelengths outside narrow wavelength bands around the first and second wavelengths.

Preferably, the choice of layer materials should be made so that the first material and the third material each have a second real part of refractive index (i.e. real part of refractive index at the second wavelength, $(1-\delta)_2$) which is intermediate between a second real part of refractive index of the second material and the fourth material.

The material having the intermediate real part of refractive index may be denoted as "intermediate index material" Using "IM" for the intermediate index material, a sequence of consecutive four layer repetitive units comprises sequences of three immediately consecutive layers of types H-IM-L or L-IM-H. Providing a layer with an intermediate type real part of refractive index between adjacent high and low refractive index material layers (for the longer second wavelength) enables a structure having a second refractive index period length (for the second wavelength) which is about twice as long as the first refractive index period length at the first wavelength. It is valuable to note that the intermediate index material (IM) plays a dual role in that it functions as a "high index material" relative to the adjacent low index material (L), and at the same time as a "low index material" relative to the adjacent high index material (H).

In such layer sequence, the first material and the third material functions as high refractive index material (H) relative to an adjacent layer on one side and, at the same time, functions as low refractive index material (L) relative to the adjacent material on the opposite side thereof.

Although the first material and the third material (i.e. the materials with intermediate real part of refractive index) may be different, it may be preferable if the first material and the third material is the same material. Manufacturing of the mirror by depositing consecutive layers is thereby facilitated because less deposition parameters need to be optimized for the process.

In some embodiments, the first material and the third material (the intermediate index material) is selected from a group consisting of boron (B), boron carbide ($B_4C$) or zirconium (Zr) and boron nitride (BN). In general, the intermediate index material should be selected so that the corresponding refractive index decrement $\delta$ is in a range between 0.02 and 0.09, particularly between 0.03 and 0.06 at the second wavelength.

Four-layer repetitive units may also be utilized to form a stack of layers which may be subdivided into a first layer group formed on the substrate and a second layer group formed on the first layer group, wherein the first layer group provides higher reflectivity at the first wavelength than at the second wavelength, and wherein the second layer group provides higher reflectivity at the second wavelength than at the first wavelength.

Each of the first and second layer group may comprise a plurality of consecutive four-layer repetitive units optimized for the respective wavelength.

A multilayer mirror according to an embodiment configured according to these principles comprises a stack of layers comprising a first layer group formed on the substrate, the first layer group comprising a plurality of first four-layer repetitive units, and a second layer group formed on the first layer group, the second layer group comprising a plurality of second four-layer repetitive units different from the first four-layer repetitive units, wherein each of the first and second four-layer repetitive units comprises: a first layer of a first material, a second layer of a second material on the first layer, a third layer of a third material on the second layer, and a fourth layer of a fourth material on the third layer, wherein a first real part of the refractive index $(1-\delta)_1$ of layer materials of the first to fourth material at the first wavelength $\lambda_1$ varies periodically in a depth direction of the stack of layers according to a first refractive index period length, a second real part of the refractive index $(1-\delta)_2$ of layer materials at the second wavelength $\lambda_2$ varies periodically in the depth direction of the stack of layers according to a second refractive index period length, and the second refractive index period length is about twice the first refractive index period length.

It is also possible to combine a first and second layer group, wherein one of the layer groups, for example the second layer group, comprises four-layer repetitive units, while the other layer group comprises two-layer repetitive units.

In a multilayer mirror the optimum periodic length of refractive index variation in the depth direction at a specific wavelength depends on the angle of incidence. Therefore, if the range of angle of incidence for which a multilayer mirror is designed deviates significantly from zero (normal incidence) then the layer thicknesses (geometric and optical) should be adapted to provide optimum reflection for the respective angles of incidence.

A two-layer or four-layer repetitive unit may include one or more additional layers, for example a diffusion barrier interlayer interposed between a low index material layer and a high index material layer or between an intermediate index material layer and an adjacent high or low index material layer. Additional functional layers may be provided between the substrate and the stack of layers, for example for layer stress compensation, and/or on the radiation incidence side of the stack of layers. For example, a cap layer on top of the stack of layers may be provided to improve resistance of the mirror against degradation. A cap layer material may be selected from a group consisting of niobium oxide (NbO, $NbO_2$, $Nb_2O_5$), molybdenum carbide ($Mo_2C$, MoC), silver (Ag), ruthenium (Ru), palladium (Pd), rhenium (Rh) or compounds thereof, for example.

The invention also relates to an EUV optical system comprising at least one multilayer mirror as described above or below. The optical system may be an illumination system or a projection lens of a microlithography projection exposure apparatus. It is also possible to utilize an EUV mirror according to the present disclosure in a microscopy optical system or in an inspection system.

The above and further features are evident not only from the claims but also from the description and from the drawings, wherein the individual features can in each case be realized by themselves or as a plurality in the form of sub-combinations in an embodiment of the invention and in other fields and can constitute advantageous and inherently protectable embodiments. Exemplary embodiments of the invention are illustrated in the drawings and explained in greater detail below.

BRIEF DESCRIPTION OF THE DRAWINGS

FIG. 2 shows a diagram of reflectivity of a mirror according to a first embodiment with two reflectivity peaks at about 6.7 nm and about 13.5 nm;

FIGS. 3 and 4 show diagrams illustrating the dependence of reflectivity of the mirror as a function of the angle of incidence of radiation at the first wavelength (FIG. 3) and at the second wave length (FIG. 4);

DETAILED DESCRIPTION

Various aspects of the invention are now explained in connection with exemplary embodiments of multilayer mirrors capable of reflecting extreme ultraviolet (EUV) radiation effectively in two spectrally separated wavelength bands at normal incidence or near normal incidence of the EUV radiation.

Figure 1:
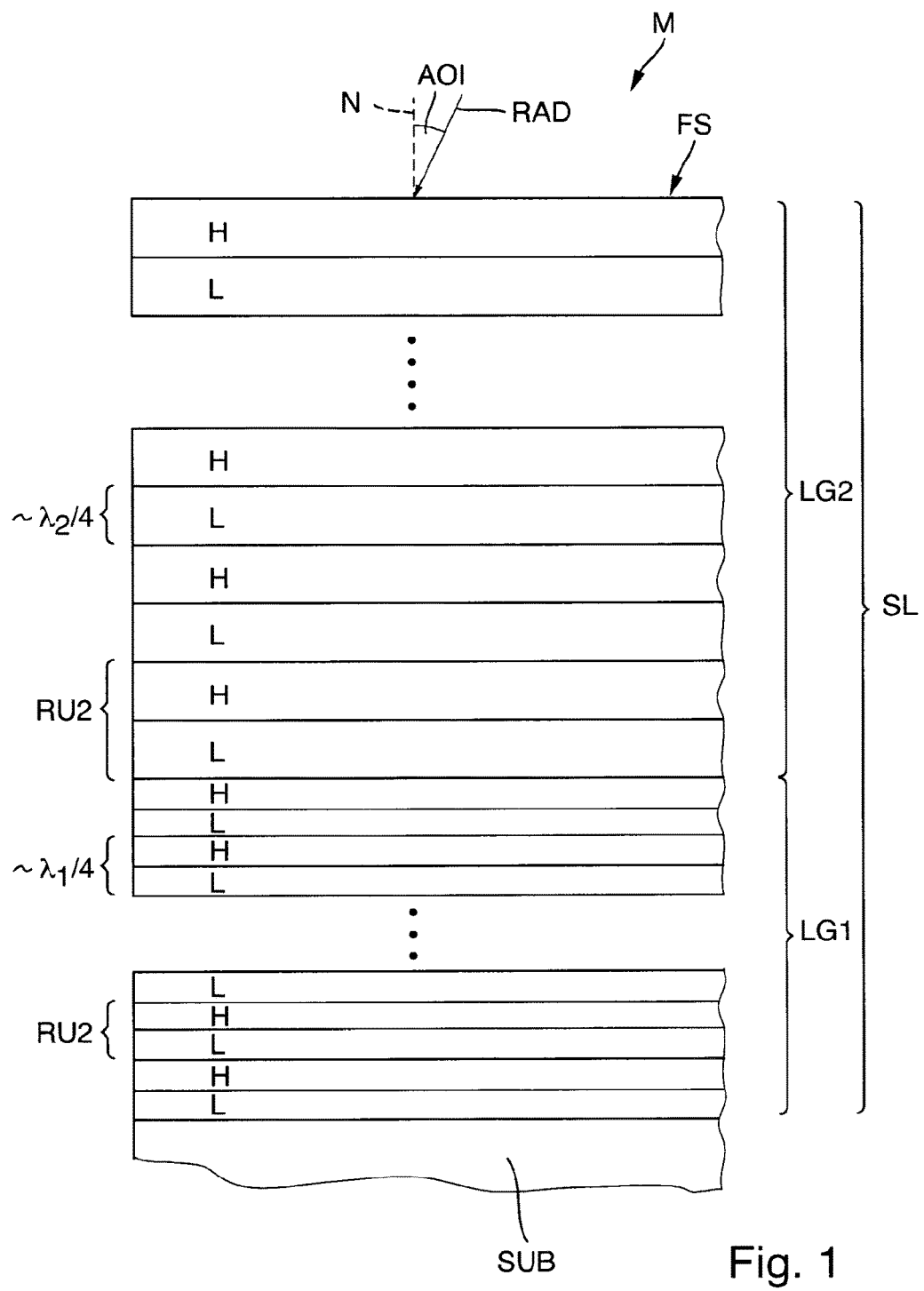
FIG. 1 shows a schematic section through a layer structure of an EUV mirror according to a first embodiment.

FIG. 1 shows a schematic vertical section through the multilayer structure of EUV mirror according to a first embodiment M. Mirror M comprises a substrate SUB and a stack of layers, SL, formed on the substrate. The stack of layers may also be denoted as "layer stack" SL. An outermost layer of the stack of layers, SL, forms the free surface FS of the multilayer mirror on the radiation incidence side.

In operation, EUV radiation RAD is incident from vacuum on the mirror. For each radiation ray (arrow) entering the stack of layers the respective angle of incidence, AOI, is given by the angle between the ray direction at the point of incidence on the mirror surface, and the surface normal N of the mirror at the point of incidence. In an optical system operating at a finite numerical aperture, rays of radiation enter the mirror from various angles of incidence which may be characterized by a mean angle of incidence.

The stack of layers is formed on the surface of the substrate SUB, which is machined to optical quality to exhibit the desired surface shape, which may be plane or curved. The single layers of the layer stack SL are then deposited on the substrate using a suitable deposition technique, such as Physical or Chemical Vapor Deposition (PVD or CVD). One or more additional layers may be formed on the surface of the substrate prior to depositing the layers of the layer stack, for example to improve mechanical stress properties on the substrate side of the stack of layers.

The stack of layers comprises layers made of a "low index material" (letter "L") and adjacent layers made of a "high index material" (letter "H") deposited on each other in alternate fashion. In a pair of adjacent layers, the low index material is the material having the lower real part of the refractive index at a given operating wavelength than the adjacent high index material. The layer stack SL is thereby formed by a large number of two-layer repetitive units, RU2, each including a low index material layer and an adjacent high index material layer. Such repetitive units may also be referred to as "bilayer".

The stack of layers may be subdivided into two separate layer groups with differing reflecting properties. A first layer group LG1 is formed on the substrate. A second layer group LG2 is formed on the first layer group LG1 so that the first layer group LG1 is sandwiched between the second layer group LG2 and the substrate. Radiation entering through the free surface of the stack of layers needs to pass through the second layer group LG2 to reach the first layer group, and radiation reflected by the first layer group LG1 must pass through the second layer group LG2.

The layer structure is designed with respect to layer materials and layer thicknesses so that the first layer group LG1 provides higher reflectivity for the first wavelength $\lambda_1$ than for the second wavelength $\lambda_2$, while the second layer group LG2 provides higher reflectivity for the second wavelength $\lambda_2$ than for the first wavelength $\lambda_1$.

The layer structure of the first embodiment is designed so that the mirror provides a first peak of reflectivity with more than 30% reflectivity at a first wavelength $\lambda_1=6.7$ nm, and a second peak of reflectivity (reflectivity greater than 40%) at a second wavelength $\lambda_2=13.5$ nm (see FIG. 2).

The complex refractive index n of a material may be described as a sum of the real part $(1-\delta)$ and the imaginary part $i\beta$ of the refractive index in accordance with $n=(1-\delta)+i\beta$. Table 1 summarizes optical constants for some materials including materials suitable as layer materials for mirrors reflecting both at about 6.7 nm and about 13.5 nm. Values are taken from a library provided by 1 MB simulation software described in: D. L. Windt, "1 MB—software for modeling the optical properties of multilayer films", Computers in Physics 12, 360 (1998).

TABLE 1

| | 13.5 nm | | | 6.8 nm | | |
|---|---|---|---|---|---|---|
| | δ | 1-δ | β | δ | 1-δ | β |
| La | −0.00409 | 1.00409 | 0.00622 | 0.01700 | 0.98300 | 0.00117 |
| LaN | 0.00561 | 0.99439 | 0.00715 | 0.01478 | 0.98522 | 0.00114 |
| a-Si | 0.00051 | 0.99949 | 0.00171 | 0.00756 | 0.99244 | 0.00922 |
| Mo | 0.07836 | 0.92164 | 0.00637 | 0.01350 | 0.98650 | 0.00291 |
| B4C | 0.03610 | 0.96390 | 0.00512 | 0.00313 | 0.99687 | 0.00056 |
| B | 0.03192 | 0.96808 | 0.00410 | 0.00104 | 0.99896 | 0.00044 |
| Ag | 0.109699 | 0.890301 | 0.079374 | 0.01807 | 0.98193 | 0.004117 |
| Ba | −0.01057 | 1.010572 | 0.007055 | 0.008648 | 0.991352 | 0.000622 |
| BN | 0.03726 | 0.96274 | 0.008817 | 0.006492 | 0.993508 | 0.000939 |
| Li | 0.009679 | 0.990321 | 0.010853 | 0.003191 | 0.996809 | 0.000924 |
| Mo2C | 0.082227 | 0.917773 | 0.007945 | 0.014993 | 0.985007 | 0.002945 |
| MoC | 0.087582 | 0.912418 | 0.009287 | 0.016492 | 0.983508 | 0.002981 |
| MoO2 | 0.065906 | 0.934094 | 0.01682 | 0.014641 | 0.985359 | 0.00302 |
| Nb | 0.066245 | 0.933755 | 0.005195 | 0.010752 | 0.989248 | 0.00253 |
| Nb2O5 | 0.093695 | 0.906305 | 0.025571 | 0.020783 | 0.979217 | 0.004384 |
| NbO | 0.079645 | 0.920355 | 0.015142 | 0.015649 | 0.984351 | 0.003435 |
| NbO2 | 0.089611 | 0.910389 | 0.02254 | 0.019291 | 0.980709 | 0.004108 |
| Pd | 0.123872 | 0.876128 | 0.046391 | 0.019881 | 0.980119 | 0.004098 |
| Rh | 0.124942 | 0.875058 | 0.031172 | 0.01971 | 0.98029 | 0.004242 |
| Ru | 0.113631 | 0.886369 | 0.017061 | 0.019121 | 0.980879 | 0.004048 |
| RuO2 | 0.079267 | 0.920733 | 0.021535 | 0.016778 | 0.983222 | 0.003427 |
| SnO | 0.067444 | 0.932556 | 0.07131 | 0.017484 | 0.982516 | 0.002656 |
| TiN | 0.065111 | 0.934889 | 0.019236 | 0.017276 | 0.982724 | 0.004399 |
| TiO2 | 0.058398 | 0.941602 | 0.022494 | 0.016093 | 0.983907 | 0.004066 |
| Zr | 0.041032 | 0.958968 | 0.003757 | 0.004687 | 0.995313 | 0.001953 |

Details of the multilayer layout of a first embodiment are given in Table 2. In Table 2, the first column (#RU2) gives the numbers of bilayers, or two-layer repetitive units RU2, in the respective layer groups, column "MAT" designates the layer materials, column d (nm) designates the geometric layer thickness.

TABLE 2

| | # RU2 | MAT | d [nm] |
|---|---|---|---|
| | | vacuum | |
| LG2 | 12 | La | 3.362 |
| | | Mo | 3.664 |
| LG1 | 250 | La | 1.702 |
| | | B4C | 1.677 |
| | | substrate | |

In the first layer group LG1, boron carbide ($B_4C$) is used as the high index material and lanthanum (La) is used as the low index material so that each two-layer repetitive unit (bilayer) includes a single layer of $B_4C$ and an adjoining single lanthanum layer. Considering the fact that the refractive index contrast (difference of real part of refractive index) between lanthanum and boron carbide is relatively small at 6.7 nm, there is a large number of N1=250 bilayers provided in the first layer group LG1 so that the desired overall reflectivity for the first wavelength is obtained.

In the second layer group LG2, molybdenum (Mo) is used as the low index material, while lanthanum (La) is used as the high index material. The material combination is selected in view of several requirements. Firstly, the refractive index contrast between La and Mo at second wavelength $\lambda_2$ is sufficiently large so that a relatively small number of bilayers (N2=12) provides sufficient reflectivity for the second wavelength. Secondly, both lanthanum and molybdenum exhibit relatively low absorption (represented by small extinction coefficient β (compare Table 1) for radiation at the first wavelength (6.7 nm) so that the radiation intended to be reflected by the first layer group LG1 can pass through the second layer group LG2 with little loss.

The optical performance of the multilayer mirror of the first embodiment can be taken from FIGS. 2 to 4. The diagram in FIG. 2 shows the reflectivity R of the multilayer mirror in a wavelength range from 5 nm to 15 nm including the first wavelength $\lambda_1$ at 6.7 nm and the second wavelength $\lambda_2$ at 13.5 nm for radiation at normal incidence (AOI=0°). FIGS. 3 and 4 show the relation between reflectivity R and the angle of incidence, AOI, for the first wavelength (FIG. 3) and the second wavelength (FIG. 4). $R_s$ is the reflectivity for s-polarized radiation, $R_P$ refers to p-polarized radiation, $R_A$ refers to the average reflectivity.

It is evident from FIG. 2 that the multilayer mirror provides about 45% reflectivity at 13.5 nm (second peak reflectivity) and, at the same time, reflectivity of about 38% at 6.7 nm (first peak reflectivity), both at normal incidence. Therefore, the multilayer mirror could be used in an optical system operating at 13.5 nm, or, alternatively, in an optical system operating at 6.7 nm. Also, the mirror could be used in an optical system which is designed to operate at both wavelengths either simultaneously or in different phases of use. For example, radiation for lithographic production may have 6.7 nm while measuring radiation may have 13.5 nm.

Also, FIGS. 3 and 4 confirm good spectral broadband properties of the multilayer mirror. A high level of reflectivity of at least 35% is obtained in the range of angles of incidence between 0° and about 5° at 6.7 nm, while an even wider acceptance range (between 0° and about) 10° is provided for the larger second wavelength.

Simulations show that the contribution to reflectivity at about 13.5 nm originates almost entirely from the second layer group. Reflectivity of the first layer group at 13.4 nm is about 0.0001. On the other hand, reflectivity at about 6.7 nm originates almost entirely from the first layer group. Reflectivity of the second layer group at 6.7 nm is about 0.000022 (each at normal incidence).

Figure 5:
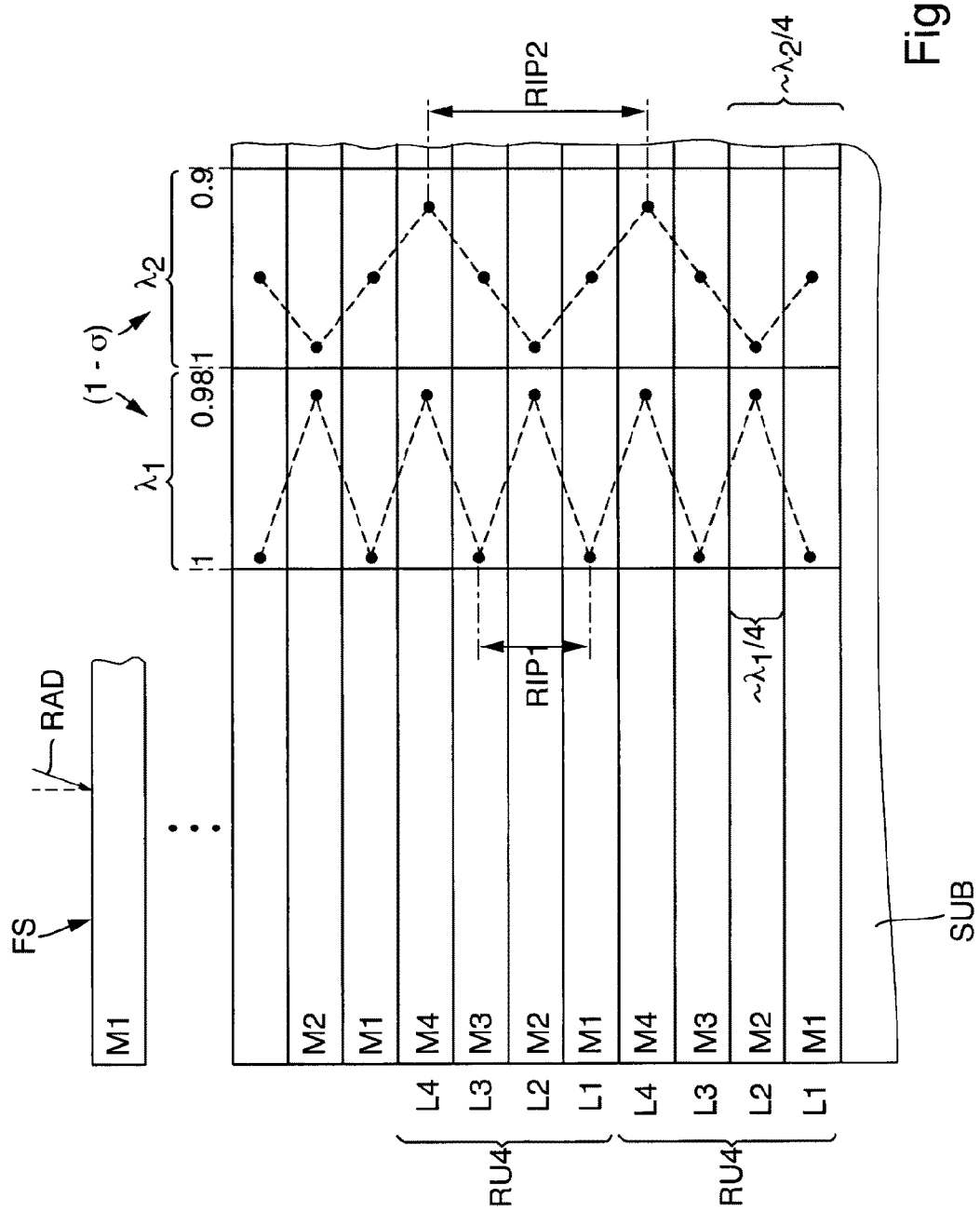
FIG. 5 shows a schematic vertical section through a multilayer structure of an EUV mirror according to a second embodiment and a schematic representation of the variation of real part of refractive index in the depth-direction for the first and second wavelength.

The following figures are intended to illustrate other layout principles for multilayer mirrors providing (at least) two peaks of reflectivity spectrally separated from each other. FIG. 5 is a schematic vertical section through the layer structure of a multilayer mirror M according to a second embodiment. A stack of layers, SL, is formed on the substrate SUB. The stack of layers comprises a plurality of four-layer repetitive units RU4. Each four-layer repetitive unit RU4 comprises a first layer L1 of a first material M1, a second layer L2 of a second material M2 formed on the first layer L1, a third layer L3 of a third material M3 formed on the second layer L2, and a fourth layer L4 of a fourth material M4 formed on the third layer. Plural four-layer repetitive units are stacked on top of each other so that a fourth layer L4 of a fourth material is also adjacent to a first layer L1 of the first material M1 at the transitions between mutually adjacent four-layer repetitive units.

The materials and material combinations are selected so that the multilayer structure is effective as a distributed Bragg reflector for both the first wavelength $\lambda_1$ and the second wavelength $\lambda_2$, while the multilayer structure is "out of tune" for other wavelengths outside narrow wavelength bands around the first and second wavelength.

Table 3 provides data for a specific example according to the second embodiment. In this example, the first material M1 is boron carbide ($B_4C$), the second material is lanthanum (La), the third material M3 is identical to the first material, i.e. $M3=B_4C$, and the fourth material M4 is molybdenum (Mo). The exemplary embodiment comprises 100 4-layer repetitive units, as given in the left column (#RU4).

TABLE 3

| # RU4 | material | d [nm] |
|---|---|---|
|  | vacuum |  |
| 100 | Mo | 1,697 |
|  | B4C | 1,684 |
|  | La | 1,702 |
|  | B4C | 1,684 |
|  | substrate |  |

The stack of layers exhibits significantly differing optical properties depending on the magnitude of the incident wavelength due to the fact that the real part of the refractive index, $(1-\delta)$, is a function of the wavelength and varies differently for different materials. The respective behavior is schematically illustrated in the right part of FIG. 5, where the respective real parts of refractive index are indicated by dots. (The dashed lines connecting the dots are for illustration purposes only. In principle, the refractive index varies in steps, not continuously. In real layer stacks small deviation of δ may occur an layer interfaces so that the steps may not be sharp. However, sufficiently sharp transitions may be achieved by using barrier layers or interface passivation).

At the shorter first wavelength $\lambda_1=6.7$ nm, boron carbide has $(1-\delta)=0.99$, while $(1-\delta)=0.987$ for molybdenum and $(1-\delta)=0.984$ for lanthanum. Therefore, where $B_4C$ and La form adjacent layers, $B_4C$ is the high index material and La is the low index material. Likewise, where Mo and $B_4C$ form adjacent layers, $B_4C$ is the high index material and Mo is the low index material. As a consequence, radiation at the first wavelength encounters a periodic change of a first real part of refractive index, $(1-\delta)_1$, in the depth direction (normal direction of the multilayer) according to H-L-H-L-H . . . . The periodic variation of the real part of refractive index at the first wavelength may be assigned a first refractive index period length RIP1. Note that RIP1 is a geometrical parameter dependent on the geometrical thicknesses of the layers rather than on the optical thickness.

The conditions with regard to refractive index variation (variation of real part of refractive index) in the depth direction are significantly different at the larger second wavelength $\lambda_2$, where each of the materials is assigned a second real part of refractive index $(1-\delta)_2$. At $\lambda_2$, the second material M2 (La) is characterized by $(1-\delta)_2=1.004$, which is the largest value of all materials in the layer stack. On the other hand, the fourth material M4 (Mo) is characterized by $(1-\delta)_2=0.922$, which is the lowest value of the real part of refractive index in the selected set of materials. Boron carbide, which is selected as the first material and the third material, exhibits a $(1-\delta)_2$-value intermediate between the $(1-\delta)_2$-values of molybdenum and lanthanum. This "intermediate" property is designated by "IM" in the following. Boron carbide would be considered as low index material when compared to lanthanum, but as a high index material when compared to molybdenum. As a consequence, a sequence of consecutive four-layer repetitive units RU4 comprises a sequence of three consecutive layers of a high index material (H), and intermediate index material (IM) and a low index material (L) according to H-IM-L, or vice versa, i.e. L-IM-H.

As a consequence, radiation at the second wavelength $\lambda_2$ entering the multilayer stack in the depth direction encounters changes of the second real part of refractive index according to H-IM-L-IM-H-IM-L-IM . . . . As illustrated in FIG. 5, the corresponding refractive index variation may be assigned a second refractive index period length RIP2, which is twice as large as the first refractive index period length RIP1.

The multilayer structure comprising consecutive four-layer repetitive units as described above results in a periodic variation in the effective (real part of) refractive index for the incident radiation, wherein the ratio between refractive index period length and wavelength is about the same for the first wavelength $\lambda_1$ and for the second wavelength $\lambda_2$. In each case, the respective refractive index period length corresponds to about half the respective wavelength. Specifically, the condition $RIP_i=(0.5\lambda_i)\pm10\%$, where i=1 and i=2.

The multilayer structure therefore acts as a Distributed Bragg Reflector efficiently reflecting only at and near the first wavelength and at and near the second wavelength, but largely out of tune at other wavelengths.

Figure 6:
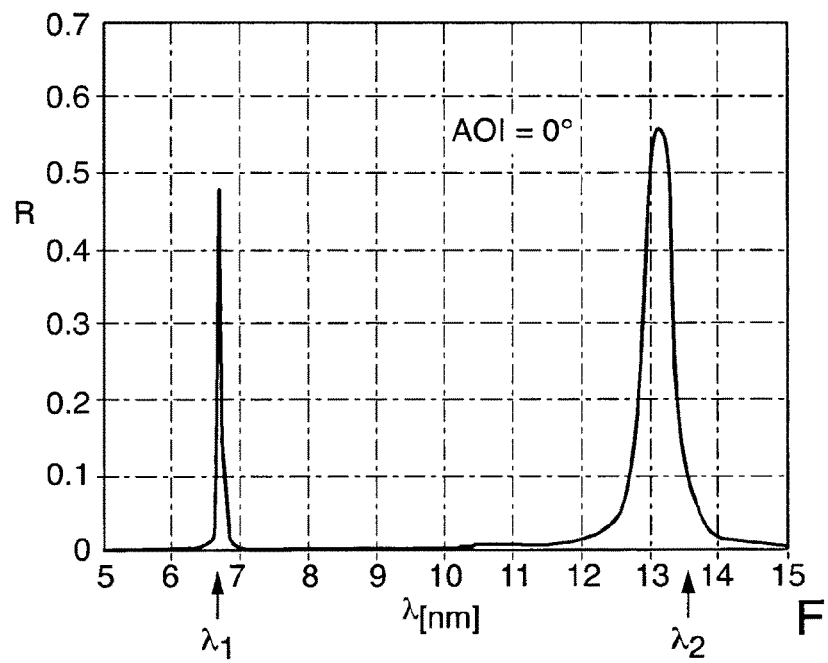
FIG. 6 shows a diagram of reflectivity of a mirror according to the second embodiment with two reflectivity peaks at about 6.7 nm and about 13.1 nm.
Figure 7:
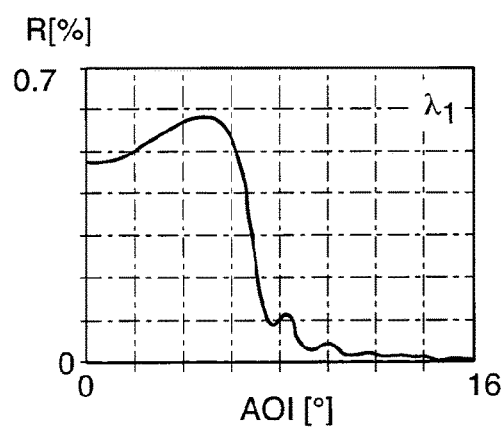
FIGS. 7 and 8 show diagrams illustrating the dependence of reflectivity of the mirror as a function of the angle of incidence of radiation for the first wavelength (FIG. 7) and the second wavelength (FIG. 8)
Figure 8:
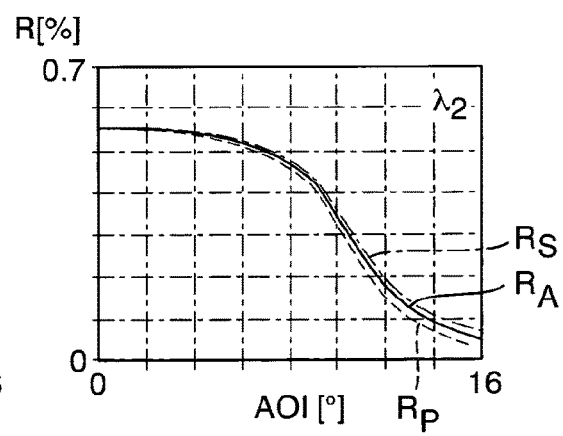

The optical performance of the multilayer mirror of the second embodiment can be taken from FIGS. 6 to 8. The diagram in FIG. 6 shows the reflectivity R of the multilayer mirror in a wavelength range from 5 nm to 15 nm including the first wavelength $\lambda_1$ at 6.7 nm and the second wavelength $\lambda_2$ at 13.1 nm for radiation at normal incidence (AOI=0°). FIGS. 7 and 8 show the relation between reflectivity R and the angle of incidence, AOI, for the first wavelength (FIG. 7) and the second wavelength (FIG. 8). $R_s$ is the reflectivity for s-polarized radiation, $R_P$ refers to p-polarized radiation, $R_A$ refers to the average reflectivity.

It is evident from FIG. 6 that the multilayer mirror provides about 56% reflectivity at 13.1 nm (second peak reflectivity) and, at the same time, reflectivity of about 48% at 6.7 nm. (first peak reflectivity) Therefore, the multilayer mirror could be used in an optical system operating at 13.1 nm, or, alternatively, in an optical system operating at 6.7 nm, or both.

Also, FIGS. 7 and 8 confirm good spectral broadband properties of the multilayer mirror. A high level of reflectivity of at least 48% is obtained in the range of angles of incidence between 0° and about 6° at 6.7 nm, while an even wider acceptance range (between 0° and about) 8° with reflectivity of 50% or more is provided for the larger second wavelength.

Table 4 provides data for a specific example according to the third embodiment. In this example, the stack of layers may be subdivided into a first layer group LG1 on the substrate and a second layer group LG2 formed on the first layer group. The first layer group comprises 60 four-layer repetitive units with $B_4C$ as a first and third material and La as the second and fourth material. The first layer group may also be described as a sub-stack of 120 two-layer repetitive units formed by $B_4C$/La bilayers. First layer group provides high reflectivity for the first wavelength.

TABLE 4

|  | # RU4 | MAT | d [nm] |
|---|---|---|---|
|  |  | Vacuum |  |
| LG2 | 40 | Mo | 1.697 = 6.7/(4 * .9871) |
|  |  | B4C | 1.684 = 6.7/(4 * .9947) |
|  |  | La | 1.702 = 6.7/(4 * .984) |
|  |  | B4C | 1.684 = 6.7/(4 * .9947) |
| LG1 | 60 | La | 1.702 = 6.7/(4 * .984) |
|  |  | B4C | 1.684 = 6.7/(4 * .9947) |
|  |  | La | 1.702 = 6.7/(4 * .984) |
|  |  | B4C | 1.684 = 6.7/(4 * .9947) |
|  |  | Substrate |  |

The second layer group LG2 provides higher reflectivity for the second wavelength than for the first wavelength at or near normal incidence. It comprises 40 four-layer repetitive units, wherein the first material is boron carbide ($B_4C$), the second material is lanthanum (La), the third material is identical to the first material, i.e. $M3=B_4C$, and the fourth material is molybdenum (Mo). The four-layer repetitive units are therefore similar to those discussed in connection with FIG. 5. Each single layer in the first and second layer group has optical thickness corresponding to one quarter of the first wavelength (6.7 nm). In the second layer group, however, the sequence of high—intermediate and low refractive index materials (H-IM-L-IM-H-IM-L . . . ) (for the second wavelength) provides twice the refractive index period length than in the first layer group. Due to low absorption of La, $B_4C$ and Mo for the first wavelength (extinction coefficients smaller than 0.003 at 6.7 nm) intensity loss at 6.7 nm in the second layer group is sufficiently small.

This embodiment is similar to the first embodiment of a bi-stack in that there are two distinctly different layer groups LG1, LG2 stacked on each other. There is also similarity to the second embodiment in that each layer group LG1, LG2 comprises four-layer repetitive units. This shows exemplarily that the respective concepts can be combined to obtain a desired reflectivity profile.

Figure 9:
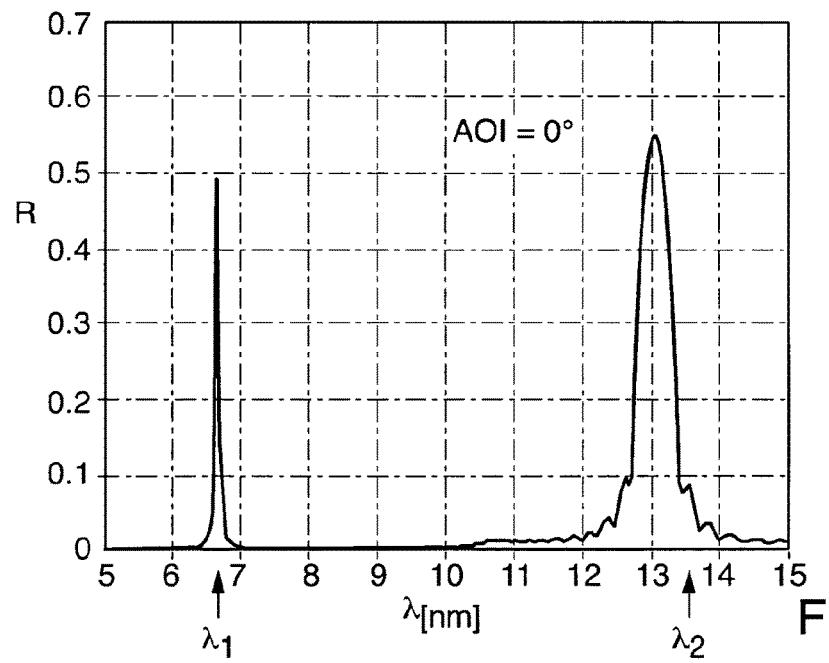
FIG. 9 shows a diagram of reflectivity of a mirror according to a third embodiment with two reflectivity peaks at about 6.7 nm and about 13.1 nm.
Figure 10:
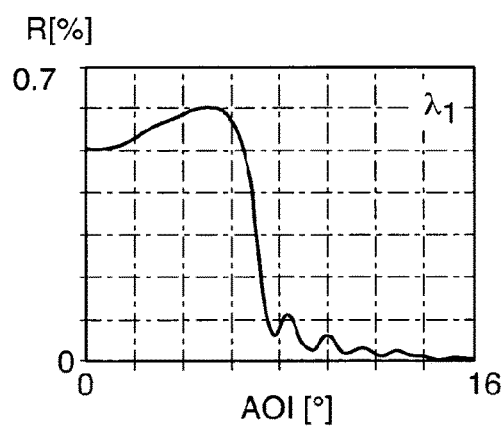
FIGS. 10 and 11 show diagrams illustrating the dependence of reflectivity of a multilayer mirror according to a third embodiment as a function of the angle of incidence of radiation for the first wavelength (FIG. 10) and the second wavelength (FIG. 11)
Figure 11:
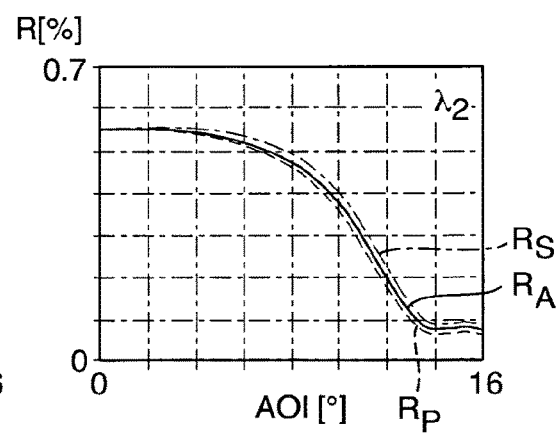

The optical performance of the multilayer mirror of the third embodiment can be taken from FIGS. 9 to 11. The diagram in FIG. 9 shows the reflectivity R of the multilayer mirror in a wavelength range from 5 nm to 15 nm including the first wavelength $\lambda_1$ at 6.7 nm and the second wavelength $\lambda_2$ at 13.1 nm for radiation at normal incidence (AOI=0°). FIGS. 10 and 11 show the relation between reflectivity R and the angle of incidence, AOI, for the first wavelength (FIG. 10) and the second wavelength (FIG. 11). $R_S$ is the reflectivity for s-polarized radiation, $R_P$ refers to p-polarized radiation, $R_A$ refers to the average reflectivity.

It is evident from FIG. 9 that the multilayer mirror provides about 54% reflectivity at 13.1 nm (second peak reflectivity) and, at the same time, reflectivity of about 49% at 6.7 nm. (first peak reflectivity) Therefore, the multilayer mirror could be used in an optical system operating at 13.1 nm, or, alternatively, in an optical system operating at 6.7 nm, or both.

Also, FIGS. 10 and 11 confirm good spectral broadband properties of the multilayer mirror. A high level of reflectivity of at least 49% is obtained in the range of angles of incidence between 0° and about 6° at 6.7 nm, while an even wider acceptance range (between 0° and about) 7° with reflectivity of 50% or more is provided for the larger second wavelength.

What is claimed is:

1. A multilayer mirror configured to reflect extreme ultraviolet (EUV) radiation, the mirror comprising:
    a substrate; and
    a stack of layers formed on the substrate,
    wherein the stack of layers comprises layers comprising a low index material and a high index material, the low index material having a lower real part of the refractive index than the high index material at a given operating wavelength $\lambda$, and
    wherein the mirror provides a first peak of reflectivity of at least 20% at a first wavelength $\lambda_1$ in a first wavelength band extending from 6 nm to 7 nm and a second peak of reflectivity of at least 20% at a second wavelength $\lambda_2$ in a second wavelength band extending from 12.5 nm to 15 nm.

2. The multilayer mirror according to claim 1, wherein a first peak reflectivity at the first wavelength is greater than 30% and a second peak reflectivity at the second wavelength is greater than 40%.

3. The multilayer mirror according to claim 1, wherein the first wavelength is between 40% and 60% of the second wavelength.

4. The multilayer mirror according to claim 1, wherein the stack of layers comprises:
    a first layer group formed on the substrate, the first layer group providing higher reflectivity at the first wavelength than at the second wavelength, and
    a second layer group formed on the first layer group, the second layer group providing higher reflectivity at the second wavelength than at the first wavelength.

5. The multilayer mirror according to claim 4, wherein materials of the layers of the second layer group are selected from a group of materials having low absorption with extinction coefficient β less than 0.05 at the first wavelength.

6. The multilayer mirror according to claim 4, wherein alternating layers of a first material and a second material form a number of consecutive two-layer repetitive units, each two-layer repetitive unit comprising a single layer of the first material and an adjacent single layer of the second material, the first layer group comprising a first number of two-layer repetitive units and the second layer group comprising a second number of two-layer repetitive units, wherein at least one of the following conditions is met:
    the first number is greater than the second number;
    the first number is more than ten times the second number;
    the first number is greater than 100 and the second number is less than 20.

7. The multilayer mirror according to claim 1, wherein the stack of layers comprises a plurality of four-layer repetitive units, each comprising:
    a first layer of a first material,
    a second layer of a second material on the first layer,
    a third layer of a third material on the second layer, and
    a fourth layer of a fourth material on the third layer, wherein a first real part of the refractive index $(1-\delta)_1$ of layer materials of the first to fourth material at the first wavelength $\lambda_1$ varies periodically in a depth direction of the stack of layers according to a first refractive index period length, a second real part of the refractive index $(1-\delta)_2$ of layer materials at the second wavelength $\lambda_2$ varies periodically in the depth direction of the stack of layers according to a second refractive index period length; and the second refractive index period length is about twice the first refractive index period length.

8. The multilayer mirror according to claim 7, wherein the respective refractive index period length corresponds to about half the respective wavelength so that RIP1=(0.5 $\lambda_1$)±10% and RIP2=(0.5 $\lambda_2$)±10%.

9. The multilayer mirror according to claim 7, wherein the first material and the third material each has a second real part of refractive index at the second wavelength which is intermediate between a second real part of refractive index of the second material and a second real part of refractive index of the fourth material.

10. The multilayer mirror according to claim 7, wherein a sequence of consecutive four-layer repetitive units comprises a sequence of three consecutive layers of a high index material, an intermediate index material and a low index material, wherein the low index material has a lower real part of the refractive index than do the high index material and the intermediate index material, and the intermediate index material has a lower real part of the refractive index than does the high index material.

11. The multilayer mirror according to claim 10, wherein the intermediate index material has a real part of the refractive index, $(1-\delta)$ in a range from 0.94 to 0.98 at the second wavelength.

12. The multilayer mirror according to claim 7, wherein the first material and the third material is selected from a group consisting of boron (B), boron carbide ($B_4C$), zirconium (Zr) and boron nitride (BN).

13. The multilayer mirror according to claim 7, wherein the first material is the same as the third material.

14. The multilayer mirror according to claim 1, wherein the stack of layers comprises:

a first layer group formed on the substrate, the first layer group comprising a plurality of first four-layer repetitive units, and a second layer group formed on the first layer group, the second layer group comprising a plurality of second four-layer repetitive units different from the first four-layer repetitive units, wherein each of the first and second four-layer repetitive units comprises:
a first layer of a first material,
a second layer of a second material on the first layer,
a third layer of a third material on the second layer, and
a fourth layer of a fourth material on the third layer, wherein:

a first real part of the refractive index $(1-\delta)_1$ of layer materials of the first to fourth material at the first wavelength $\lambda_1$ varies periodically in a depth direction of the stack of layers according to a first refractive index period length, a second real part of the refractive index $(1-\delta)_2$ of layer materials at the second wavelength $\lambda_2$ varies periodically in the depth direction of the stack of layers according to a second refractive index period length; and the second refractive index period length is about twice the first refractive index period length.

15. An EUV optical system comprising at least one multilayer mirror according to claim 1.

16. The EUV optical system according to claim 15, wherein the optical system is selected from the group consisting of:
a projection objective of a microlithography projection exposure apparatus;
an illumination system of a microlithography projection exposure apparatus;
a microscopy optical system;
an inspection system.

* * * * *

UNITED STATES PATENT AND TRADEMARK OFFICE
CERTIFICATE OF CORRECTION

PATENT NO. : 10,209,411 B2  
APPLICATION NO. : 15/078105  
DATED : February 19, 2019  
INVENTOR(S) : Goehnermeier et al.

Page 1 of 1

It is certified that error appears in the above-identified patent and that said Letters Patent is hereby corrected as shown below:

In the Specification

Column 3, Line 32, Delete "A1)" and insert -- A1). --, therefor.

Column 3, Line 34, Delete "microlithograpy," and insert -- microlithography, --, therefor.

Column 9, Line 50, Delete "11);" and insert -- 11). --, therefor.

Column 10, Line 64, Delete "1 MB" and insert -- IMD --, therefor.

Column 10, Line 65, Delete ""1 MB" and insert -- "IMD --, therefor.

Column 12, Line 55, Delete "about) 10°" and insert -- about 10°) --, therefor.

Column 14, Line 65, Delete "about) 8°" and insert -- about 8°) --, therefor.

Column 16, Line 8, Delete "about) 7°" and insert -- about 7°) --, therefor.

Signed and Sealed this  
Fourth Day of February, 2020

Andrei Iancu  
*Director of the United States Patent and Trademark Office*